United States Patent
Powell

(10) Patent No.: US 8,337,220 B2
(45) Date of Patent: Dec. 25, 2012

(54) INTERIOR NETWORK GROUND

(75) Inventor: Bruce D. Powell, Cary, NC (US)

(73) Assignee: Alcatel Lucent, Paris (FR)

( * ) Notice: Subject to any disclaimer, the term of this patent is extended or adjusted under 35 U.S.C. 154(b) by 7 days.

(21) Appl. No.: 12/569,227

(22) Filed: Sep. 29, 2009

(65) Prior Publication Data
US 2011/0076866 A1 Mar. 31, 2011

(51) Int. Cl.
*H01R 13/648* (2006.01)
(52) U.S. Cl. .......................................... 439/98
(58) Field of Classification Search ..... 439/98, 439/97, 92, 95, 108, 63, 581, 782, 812, 638; 379/413.03
See application file for complete search history.

(56) References Cited

U.S. PATENT DOCUMENTS

| | | | | |
|---|---|---|---|---|
| 4,917,615 A * | 4/1990 | Franks, Jr. | | 439/98 |
| 5,897,384 A * | 4/1999 | Hosler, Sr. | | 439/63 |
| 6,106,304 A * | 8/2000 | Huang | | 439/63 |
| 6,877,996 B1* | 4/2005 | Franks, Jr. | | 439/92 |
| 2005/0264382 A1* | 12/2005 | McMiller et al. | | 334/88 |
| 2008/0045064 A1* | 2/2008 | Tsao | | 439/260 |
| 2008/0160827 A1* | 7/2008 | Chawgo | | 439/564 |

* cited by examiner

Primary Examiner — Alexander Gilman
(74) Attorney, Agent, or Firm — Mendelsohn, Drucker, & Associates, P.C.; Steve Mendelsohn; David L. Cargille

(57) ABSTRACT

In one embodiment, a grounding bracket is provided for apparatus, such as optical network terminals (ONTs), for grounding interior electrical wiring such as coaxial cables that are electrically coupled with fiber optic fed devices. The grounding bracket provides an electrically conductive pathway for the coaxial cable, which pathway carries current safely to a ground wire from the coaxial cable. The grounding bracket carries all of the current from the coaxial cable to the ground wire without relying upon any printed circuit board (PCB) traces of the ONT to carry current to the ground wire.

27 Claims, 7 Drawing Sheets

INTERIOR NETWORK GROUND

TECHNICAL FIELD

The disclosed subject matter is directed to grounding coaxial wiring and, in particular, to grounding interior coaxial wiring.

BACKGROUND

Contemporary cable systems bring data, voice, and video to subscribers by coaxial cable to end points such as telephones, modems for computers, and set-top boxes for televisions. The coaxial cable runs from an outside plant, for example, a pole or underground feed, to an outside box or terminal, at the destination building, such as a business, residence, or multi-unit dwelling. In the outside box, splitters divide the cable for the interior system or interior wiring, where individual coaxial cables link and provide signals to telephones, set-top boxes, and modems. Since electrical signals are transmitted over the external and interior coaxial cables, the National Electrical Code requires the shields of coaxial cables to be grounded. This grounding typically occurs on an exterior coaxial cable, such as the coaxial cable that runs from the outside plant to the outside box or terminal.

For example, as shown in FIG. 1, for multi-unit buildings such as an apartment building 100 with three apartments 100a, 100b, 100c, and a basement 100d, each apartment 100a-100c is shown receiving cable service. This service, for example, includes voice, data, and video that are delivered from an outside plant 102 to a terminal 104 over an exterior coaxial cable 106. The exterior coaxial cable 106 is in two sections 106a, 106b. At the terminal 104, splitter (SP) 108 divides the exterior coaxial cable 106, for example, into two Category 5 lines 110, 112 for voice and data, respectively, and coaxial cable 114 for video for each apartment. Line 110 carries voice for telephones 120. Line 112 carries data for computer modems 122 of computers 122a, and coaxial cable 114 carries video signals for set top boxes 124 of televisions 124a.

The exterior coaxial cable 106 is grounded, for example, by a conventional supplemental adapter 126, as shown in detail in FIG. 1B. The supplemental adapter 126 receives the coaxial cable sections 106a, 106b, and grounds the coaxial cable 106 via a ground wire 128, as shown in FIG. 1. The ground wire 128 connects to a ground source, such as the ground or a grounded structure, such as a water pipe (not shown). By grounding the exterior coaxial cable 106, the coaxial cable 114, by its being electrically connected to the coaxial cable 106, is also grounded.

The supplemental ground adapter 126 includes a frame 130 with a cylindrical portion 132 for supporting threaded barrels 134a, 134b. The sections 106a, 106b of the exterior coaxial cable attach to the respective barrels 134a, 134b. Frame 130 includes flanges 136a, 136b with openings 138a, 138b for screws that attach to a support structure, such as a wall of the building 100 or the like. A body portion 140 includes a bore 142 for receiving the ground wire 128 (FIG. 1) and a tapped hole (not shown) for receiving a screw 144. The screw 144 clamps the ground wire 128 in a secure physical contact with the body portion 140, resulting in a secure electrical contact therewith.

Since the demand for broadband bandwidth has increased to accommodate advanced generations of voice, video, and data transmission, fiber optic cable is rapidly replacing coaxial cable. FIG. 2 shows the delivery method and system for voice, video, and data known as "fiber to the home." For multi-unit buildings such as an apartment building 200 with three apartments 200a, 200b, 200c, and a basement 200d, each apartment 200a-200c is shown receiving broadband service. This service, for example, includes voice, data, and video, which is delivered from an outside plant 202 to a terminal or communications room 204 of the building 200 over fiber optic lines 206.

Splitter (SP) 208 divides the fiber optic lines 202 into three fiber optic lines 210, each connected to an interior optical network terminal (ONT) 212 residing in a different apartment 200a, 200b, 200c. Each interior ONT 212 converts optical signals, received from a corresponding fiber optic line 210, into electrical signals for transmission to (i) voice devices, such as telephone 220, (ii) data devices, such as modems 222 for computers 222a, and (iii) video devices, such as set topboxes 224 for televisions 224a, and vice versa for converting electrical signals from those devices into optical signals for transmission over fiber optic line 202. Voice devices 220 connect to the interior ONT 212 by regular telephone wiring 230 into conventional telephone ports of the ONT 212, and data devices 222 connect to the interior ONT 212 by Category 5 cable 232 into conventional ports. However, set-top boxes 224 connect to the interior ONT 212 by a coaxial cable 234. Since coaxial cable 234 is located entirely within building 208, it is referred to as an interior coaxial cable or interior wiring.

The replacement of the external coaxial cables and some interior coaxial cables with fiber optic cables has made obsolete the traditional approach to providing grounding for the interior coaxial cable. Unlike coaxial cable, fiber optic cable does not carry electrical signals and, accordingly, is non-conducting. The National Electrical Code does not specify grounding for non-conducting fiber runs into buildings and, also, does not specify grounding for interior coaxial cables and other interior wiring fed by non-conducting fiber optic cables. However, many government authorities and customers insist on grounding of these interior coaxial cables.

There are two prevailing solutions for grounding interior coaxial cables, like coaxial cables 234. A first solution involves coupling a supplemental ground adapter, such as the adapter 126 of FIG. 1B or a similar structure, to the coaxial cable and running a ground wire from the adapter to ground. This method exhibits drawbacks as it adds two connections, each connection causing signal loss, as well as an additional piece of hardware that must be stocked by installers.

FIG. 3 shows another solution, where a ground wire 302 is directly connected by a conductive metal rivet 304 to the conductive metal traces 306 or ground of the printed circuit board (PCB) 308 of the ONT 310. In this solution, the ground path runs through the PCB 308, which places the PCB 308 at the risk of failing. Additionally, the ground path may transfer the ground fault directly through other circuits on the PCB 308, resulting in the ONT 310 being destroyed.

SUMMARY

The disclosed subject matter provides an efficient and aesthetically pleasing grounding solution for interior coaxial cables. It eliminates the need for additional grounding hardware components. The disclosed subject matter provides for accommodating a supplemental grounding block without subjecting PCB traces to ground-fault current. The disclosed subject matter provides a grounding bracket for interior coaxial cables and other associated interior network wiring that is suitable for use with ONTs, including ONTs used for "fiber to the home" delivery of voice, video, and data.

The grounding bracket provides an electrically conductive pathway for the coaxial cable, which pathway carries current safely to a ground wire from the coaxial cable. The grounding bracket carries all of the current from the coaxial cable to the ground wire without relying upon any PCB traces to carry current to the ground wire. Accordingly, should a surge occur, the PCB and its components, for example, ONT terminal circuits, will not be destroyed, since the grounding bracket has safely redirected the harmful electric current.

One embodiment of the disclosed subject matter includes a grounding bracket for grounding a coaxial cable connected to a barrel of an electronic device. The coaxial cable has an inner conductor and an outer conductive sheath, electrically separated from the inner conductor, and, the barrel has a conductive inner port and a conductive outer surface electrically separated from the conductive inner port. The grounding bracket comprises a body of an electrically conductive material, and the body includes a first portion and a second portion. The first portion is adapted to be electrically connected to the conductive outer surface of the barrel. The second portion is electrically connected to the first portion and is adapted to be electrically connected to a ground wire, such that the grounding bracket provides a grounding path between the conductive outer sheath of the coaxial cable and the ground wire, via the conductive outer surface of the barrel.

Another embodiment of the disclosed subject matter is an electronic device. The electronic device comprises signal processing circuitry for converting received signals into electrical signals, a connector for a coaxial cable for carrying electrical signals, the connector electrically coupled with the signal processing circuitry and including a barrel having a conductive inner port and a conductive outer surface electrically separated from the conductive inner port, a printed circuit board (PCB) for supporting the signal processing circuitry and the connector, the printed circuit board including a ground, and, a grounding bracket for grounding a coaxial cable connected to the barrel, the coaxial cable having an inner conductor and an outer conductive sheath electrically separated from the inner conductor. The grounding bracket includes a first portion and a second portion. The first portion is adapted to electrically couple to i) the conductive outer surface of the barrel, and ii) the PCB ground. The second portion is electrically connected to the first portion and is adapted to be electrically connected to a ground wire, such that the grounding bracket provides a grounding path between the conductive outer sheath of the coaxial cable and the PCB ground and the ground wire.

Another embodiment of the disclosed subject matter is directed to a method for grounding an interior coaxial cable. The method comprises providing a grounding bracket for grounding a coaxial cable and creating a grounding path. The grounding path is created by placing a first portion of the grounding bracket into electrical contact with an electrically conductive outer surface of a barrel of an electronic device, and electrically coupling a second portion of the grounding bracket with a ground wire. A coaxial cable is connected on the barrel, wherein the conductive sheath of the coaxial cable is electrically coupled with the grounding path.

BRIEF DESCRIPTION OF THE DRAWINGS

Attention is now directed to the drawing figures, where like or corresponding numerals indicate like or corresponding components. In the drawings.

DETAILED DESCRIPTION OF THE DRAWINGS

Figure 1:
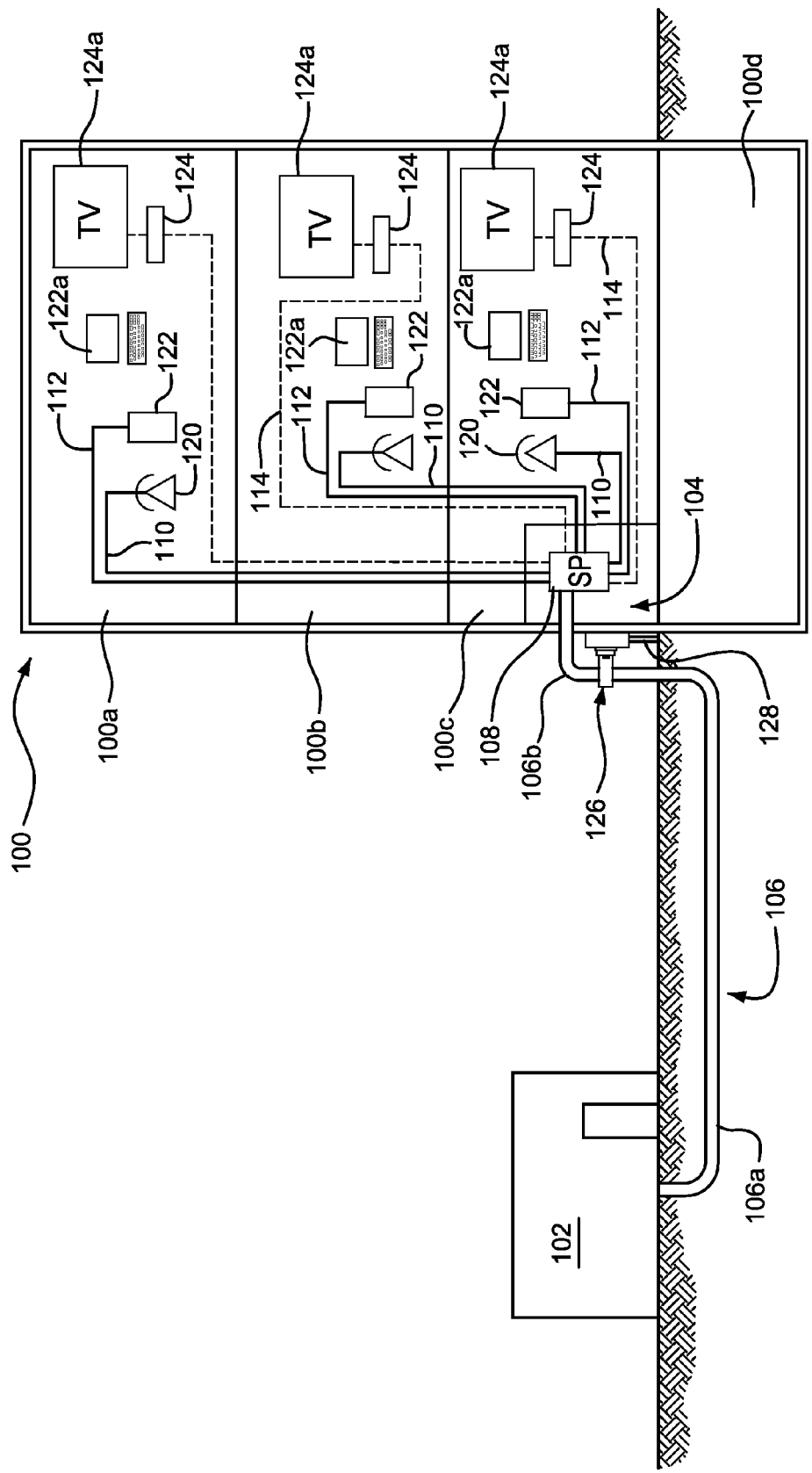
FIG. 1 is a block diagram showing cable service delivered over coaxial cables.
Figure 1B:
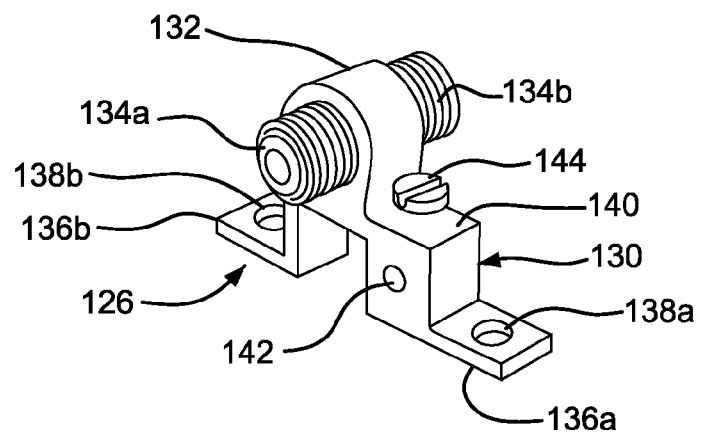
FIG. 1B is a perspective view of a supplemental adapter from the diagram of FIG. 1.
Figure 3:
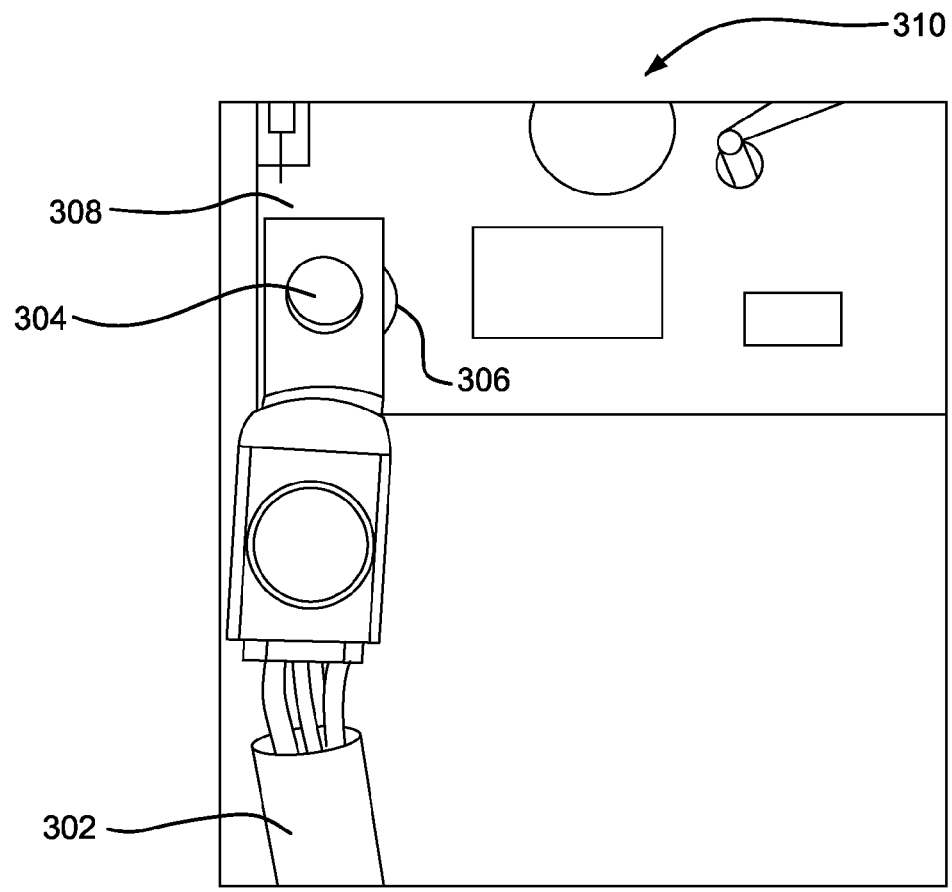
FIG. 3 shows a front view of a conventional grounding solution for an interior coaxial cable.
Figure 2:
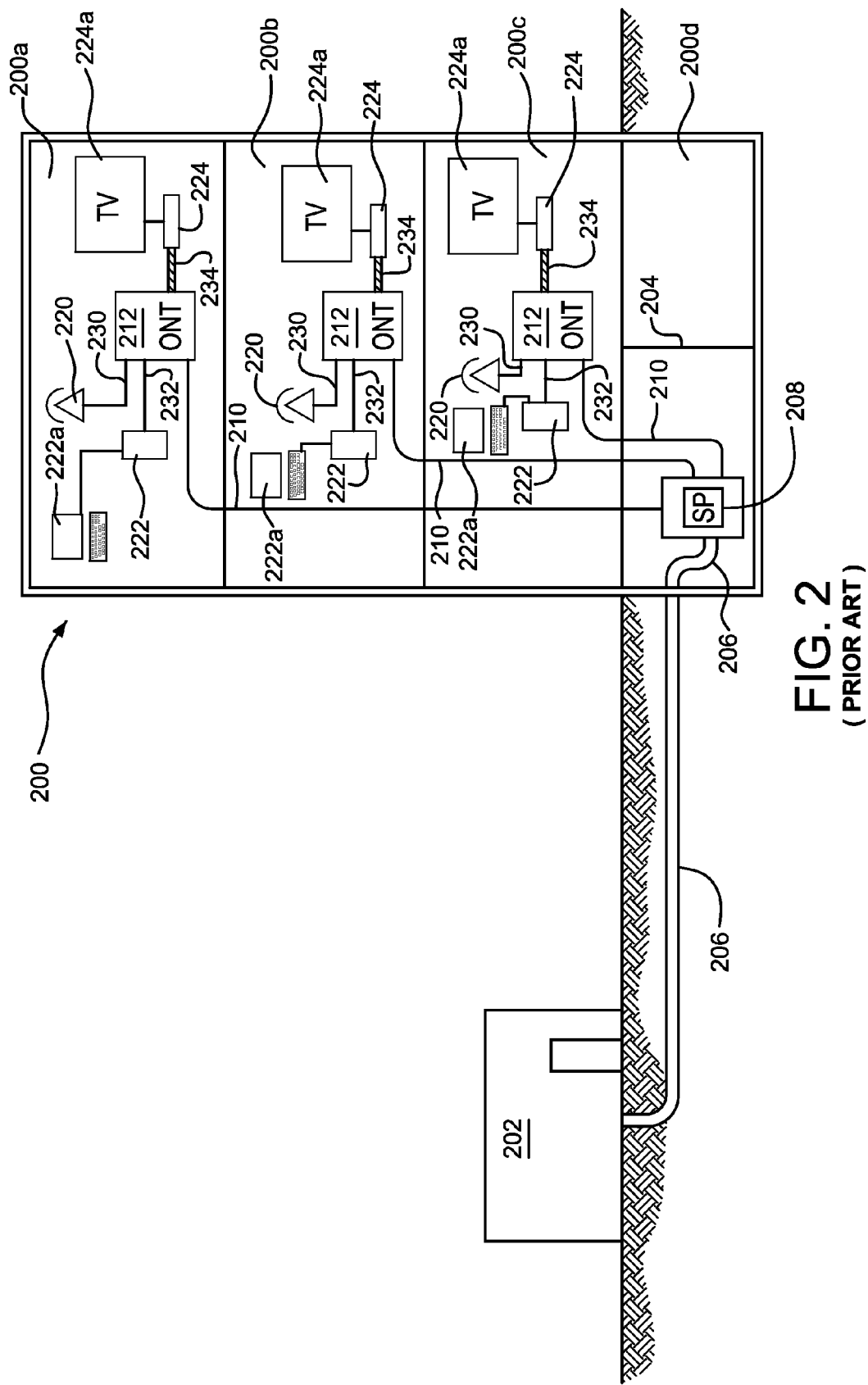
FIG. 2 is a block diagram showing cable service delivered over fiber optic cables into a dwelling and with a portion then converted to conventional coaxial cable delivery.
Figure 4A:
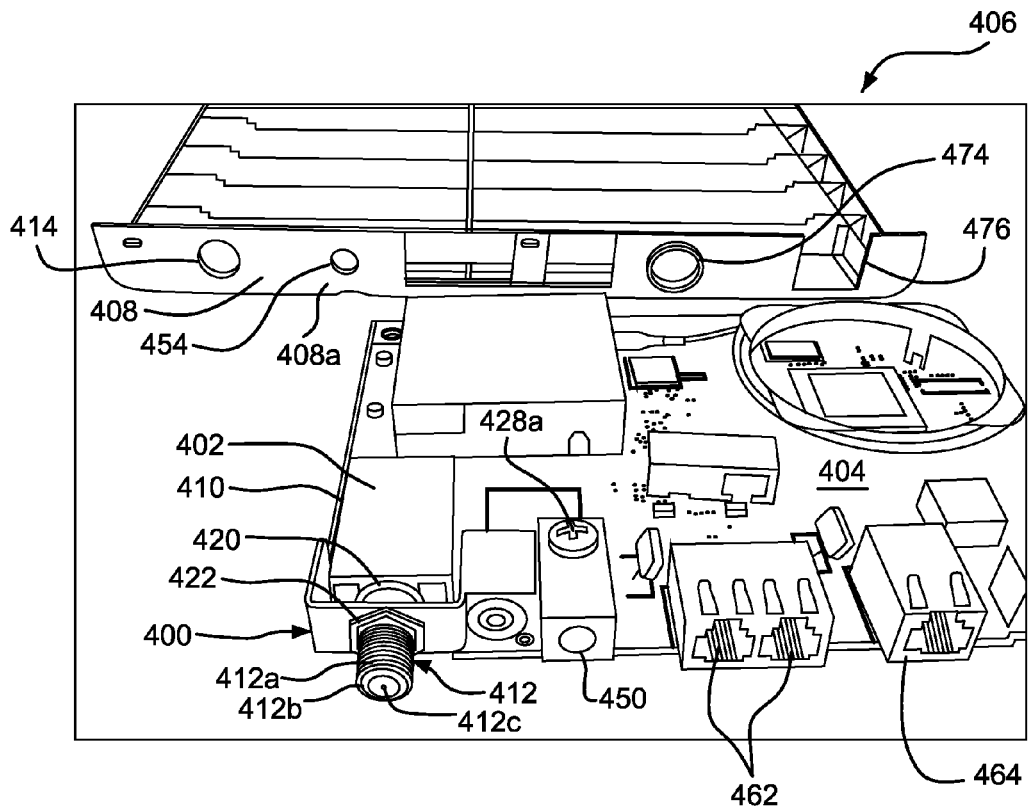
FIGS. 4A and 4B show perspective views of the disclosed grounding block in operation in an interior ONT.
Figure 4B:
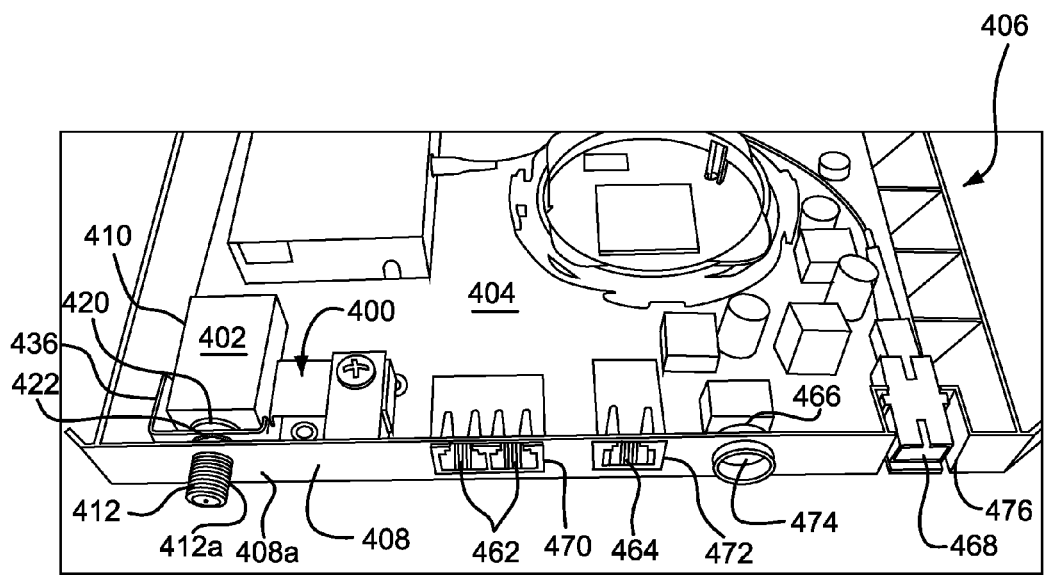
Figure 4C:
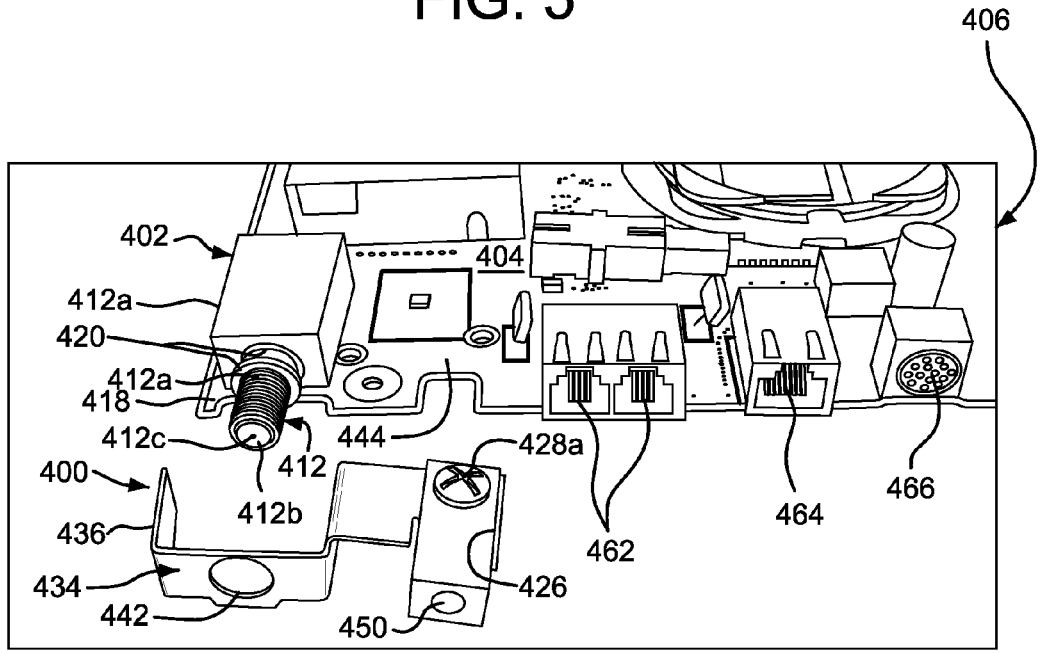
FIG. 4C is a perspective view of the interior ONT of FIGS. 4A and 4B with the ground bracket removed.

FIGS. 4A-4C show a grounding bracket 400 of the disclosed subject matter in an exemplary operation with a coaxial cable connector 402, where the grounding bracket 400 and coaxial cable connector 402 are mounted on a PCB 404 of an ONT 406. The ONT 406, for example, includes signal processing circuitry and other related components for functions including converting optical signals into electrical signals, and vice versa. The PCB 404 is enveloped in the housing 408 of the ONT 406, as shown in FIG. 4B. The ONT 406 is, for example, an Alcatel-Lucent 7342 ISAM FTTU, available from Alcatel-Lucent of Paris, France (Murray Hill, N.J. in the USA) and described in *Alcatel-Lucent 7342 Intelligent Service Access Manager (ISAM) Fiber to the User (FTTU)*, 2007, the teachings of which are incorporated herein by reference. Other commercially available ONTs are also suitable for use with the disclosed subject matter.

Figure 6A:
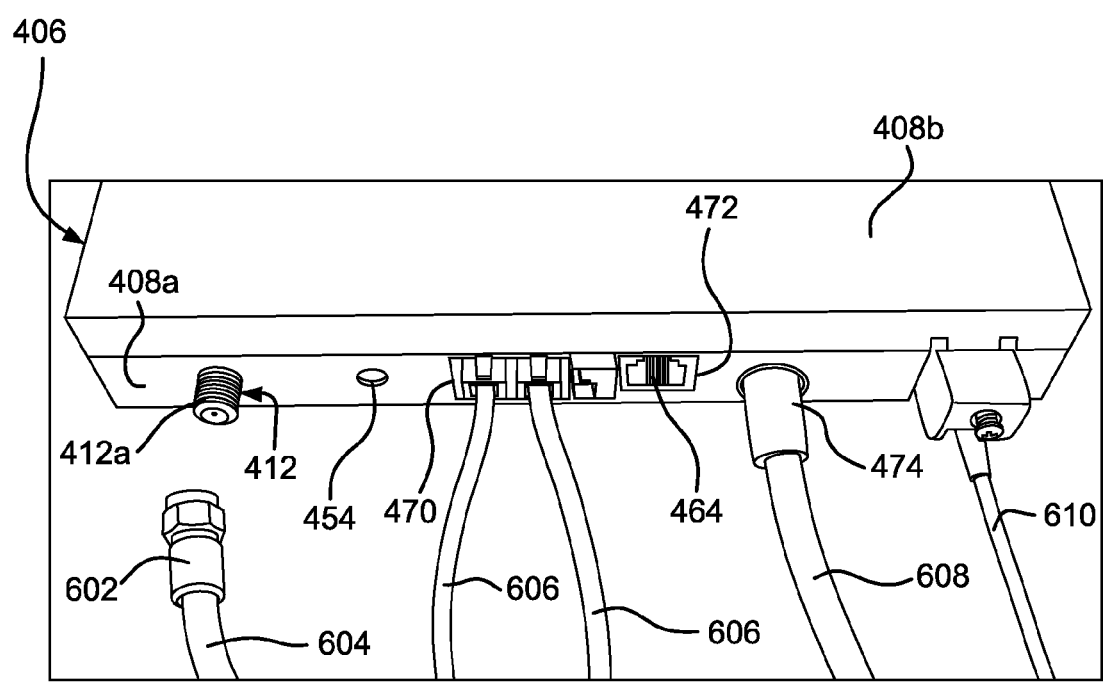
FIGS. 6A and 6B are side views showing the various connections to cables and wires for the interior ONT of FIG. 4B.
Figure 6B:
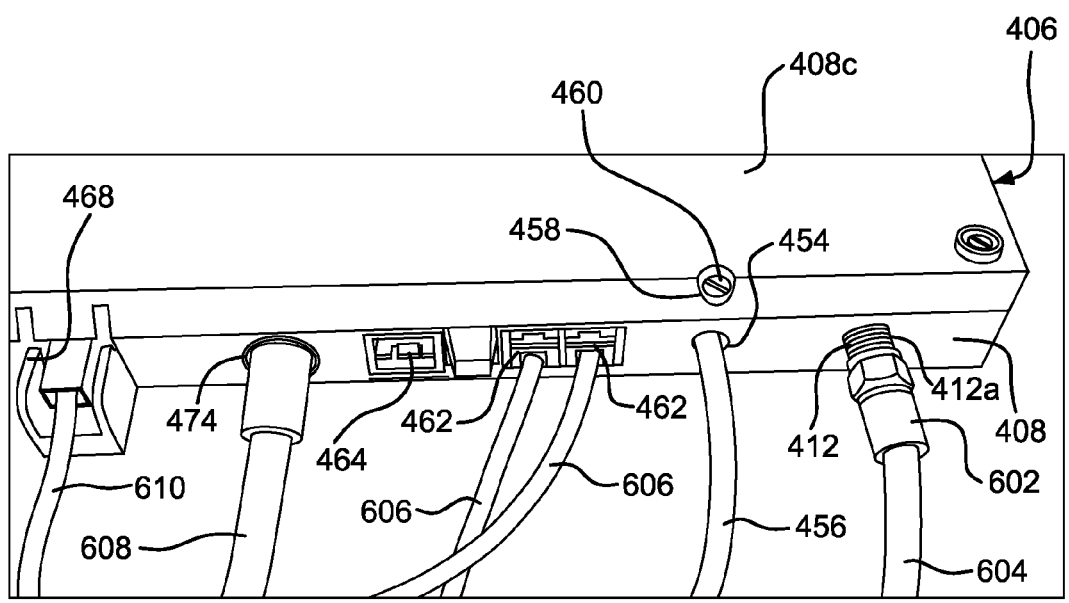

Coaxial connector 402 includes a body 410 and a barrel 412 for receiving the connector 602 of the coaxial cable 604 (FIGS. 6A and 6B). The barrel 412 extends from the body 410 and protrudes through an opening 414 in the wall 408a of the housing 408. The body 410 is joined to the PCB 404 so as to be in contact with the ground traces 418 of the PCB 404 (these ground traces collectively are known as the PCB ground, and these terms are used interchangeably herein). The joining is, for example, by techniques such as soldering and the like.

The barrel 412 is, for example, a threaded barrel for receiving a standard connector of a coaxial cable, for example, an F-connector 602 (FIGS. 6A and 6B). Barrel 412, for example, includes a threaded outer surface 412a of an electrically conductive material, such as an electrically conductive metal, for engaging a correspondingly threaded inner electrically conductive surface of a coaxial cable connector (for example, the F-connector 602 that is in electrical contact with the shield layer of the coaxial cable 604 (FIGS. 6A and 6B)). The barrel 412 includes an electrically insulating middle layer 412b, for example, a ceramic insulator, with a bore 412c extending therethrough. The bore 412c receives the conductor of the coaxial cable 604 in electrical contact with the components of the diplexer 416. Alternatively, the barrel 412 may be one of various types of coaxial cable connectors including UHF connectors, N-type connectors, BNC connectors, TNC connectors, SMA connectors, SMB connectors, SMC connectors, MCX connectors, MMCX connectors, and the like.

A spacer ring 420 is joined to the barrel 412. This joining is, for example, by an internal toothed lock washer 422 and a nut (not shown) that is received in the body 410. The spacer ring 420 is of a larger peripheral diameter than the opening 442 of the main portion 424 of the grounding bracket 400 and coupled with the wall 408a, defines a bounded area along the barrel 412 for retaining the grounding bracket 400 in the ONT 406.

Figure 5:
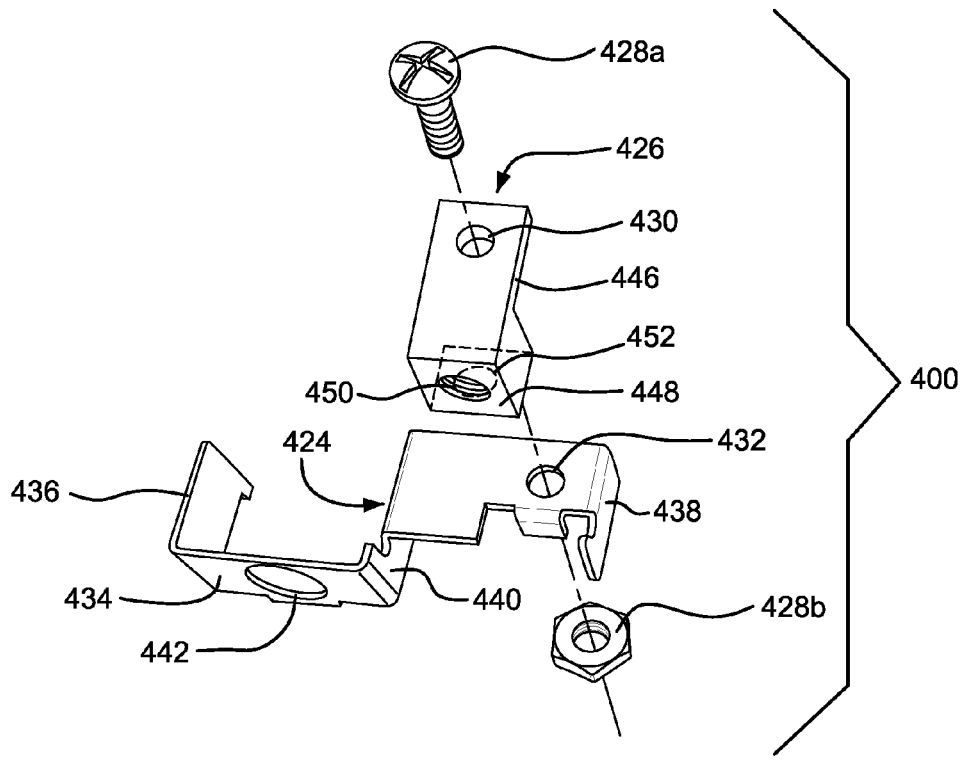
FIG. 5 is an exploded perspective view of the ground bracket of FIG. 4C.

Turning also to FIG. 5, grounding bracket 400 includes a main portion 424 and a ground lug 426, joined to each other by a screw 428a and nut 428b that extend through openings 430, 432 in the main portion 424 and ground lug 426, respectively. The joining is such that the main portion 424 and ground lug 426 are in electrical contact. Other joining mechanisms are also permissible, provided they maintain the aforementioned electrical contact between the main portion 424 and the ground lug 426. For example, the ground lug 426 rests on the main portion 424 in both electrical and physical contact. This arrangement may be reversed, with the main portion 424 resting on the ground lug 426 in both electrical and physical contact.

The main portion 424 includes a central member 434, an external lateral flange 436, and an arm 438. The arm 438 extends from an internal lateral flange 440 that extends from the central member 434. The central member 434 has an aperture or opening 442 of a diameter slightly larger than that of the barrel 412, for moving over the barrel 412 (but less than the peripheral diameter of the spacer ring 420), and allowing for electrical and physical contact with electrically conductive threaded outer surface 412a of the barrel 412.

The external lateral flange 436 extends from the central member 434, for example, at a perpendicular orientation thereto, for electrical and physical contact with the PCB ground 418. The external lateral flange 436 is typically joined to the PCB ground 418, for example, by soldering or the like, although this joining is not required. Although the PCB ground 418 is in electrical contact with the grounding bracket 400, the primary conductive path for the coaxial cable is directly through barrel 412 and grounding bracket 400.

The internal lateral flange 440 extends from the central member 434, for example, at a perpendicular orientation thereto. The arm 438 includes the opening 430 for receiving the screw 428a for attachment to the ground lug 426. The arm 438 and ground lug 426 fit in an open area 444 on the PCB 404. This area 444 is free of electrically conductive traces.

The ground lug 426 is, for example, L-like in shape, and includes a tail 446 extending from a body 448. The tail 446 includes the opening 432 for receiving the screw 428a. The body 448 is of a thickness to accommodate two bores 450, 452, that join together, for example, from a perpendicular orientation. One bore 450, coupled with aligned opening 454 on the housing wall 408a, receives a ground wire 456 (FIG. 6B), while an access bore 452, aligned with an opening 458 in the housing wall 408c, receives a screw 460 (FIG. 6B) for securing the ground wire 456 in a clamping manner to provide physical and electrical contact with the body 448. The ground lug 426 is capable of supporting 8-gauge to 14-gauge ground wire, for carrying up to 30 amperes of current.

The main portion 424 and ground lug 426 are, for example, unitary members of electrically conducting material, such as electrically conducting metal. However, the main portion 424 and ground lug 426 may also be formed of multiple pieces, joined together by conventional joining techniques, so as to remain electrically conductive. The main portion 424 and ground lug 426 may be of the same or different material. The screw 428a and nut 428b are also of electrically conducting material, such as electrically conducting metal, and may be of the same material as the main portion 424, the ground lug 426, or both.

The ONT 406 also includes ports 462 for POTS (plain old telephone system) line connections, an Ethernet port 464, a unit power and alarm port 466, and a fiber optic cable port 468, with corresponding openings 470, 472, 474, 476 in the wall 408a of the housing 408 of the ONT 406.

FIGS. 6A and 6B show the ONT 406 with the connections made to support fiber optic voice, video, and data transmission, as seen along an upper wall 408b (FIG. 6A) and a lower wall 408c (FIG. 6B) of the housing 408. The barrel 412 extends from the housing 408 through an opening 414 in the wall 408a. The barrel 412 receives the connector 602, for example, an F-connector that is electrically coupled to the shield of the coaxial cable 604.

The ground wire 456 is received through opening 462, while the screw 460 is received in the opening 458 and the access bore 452 of the lower wall 408c. The ground wire 456 is then connected to a ground or ground source, such as a water pipe. Telephone cables 606 connect at the POTS ports 462, while a unit power and alarm cable 608 connects at the power and alarm port 466. A fiber optic cable 610 connects to the fiber optic cable port 468.

While the grounding bracket 400 is shown with an ONT 406; the grounding bracket 400 may be used, or modified in accordance with the disclosure above for use, with any distribution box that supports interior coaxial cable, for grounding interior coaxial cables or other interior wiring.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

While preferred embodiments have been described, so as to enable one of skill in the art to practice the disclosed subject matter, the preceding description is intended to be exemplary only. It should not be used to limit the scope of the disclosed subject matter, which should be determined by reference to the following claims.

The invention claimed is:

1. A grounding bracket for grounding a coaxial cable connected to a barrel of an electronic device, the coaxial cable having an inner conductor and an outer conductive sheath electrically separated from the inner conductor, the barrel having a conductive inner port and a conductive outer surface electrically separated from the conductive inner port, the grounding bracket comprising:
   a body of an electrically conductive material, the body including a first portion and a second portion, wherein:
      the first portion is adapted to be electrically connected directly to the conductive outer surface of the barrel of the electronic device;
      the second portion, electrically connected to the first portion, is adapted to be electrically connected to a ground wire, such that the grounding bracket provides a grounding path between the conductive outer sheath of the coaxial cable and the ground wire via the conductive outer surface of the barrel;
      the first portion includes an aperture for receipt on the barrel, the aperture configured for seating on the conductive outer surface of the barrel; and
      the first portion of the grounding bracket comprises:

a central member including the aperture;
a first lateral flange extending from the central member; and
an arm member extending from the lateral flange and electrically connected to the second portion.

2. The grounding bracket of claim 1, wherein the first portion and the second portion are a unitary member.

3. The grounding bracket of claim 1, wherein the first portion and the second portion are separate members in electrical communication.

4. The grounding bracket of claim 1, wherein the first portion includes a flange for electrically coupling with a ground of a printed circuit board (PCB).

5. The grounding bracket of claim 1, wherein the second portion includes a first bore for receiving a ground wire.

6. The grounding bracket of claim 5, wherein the second portion includes a second bore to accommodate a screw to clamp the ground wire into electrical contact with the second portion, the second bore in communication with the first bore.

7. The grounding bracket of claim 6, wherein the first bore is oriented substantially perpendicular with respect to the second bore.

8. The invention of claim 1, wherein the electronic device is adapted for mounting within a housing, and the first and second portions of the grounding bracket have dimensions that conform to dimensions of the housing.

9. The invention of claim 1, wherein (i) the electronic device is a printed circuit board assembly and (ii) the first and second portions of the grounding bracket have dimensions that conform to dimensions of the printed circuit board assembly.

10. The invention of claim 1, wherein:
the first lateral flange extends approximately perpendicularly from the central member; and
the arm member extends approximately perpendicularly from the first lateral flange.

11. The invention of claim 1, wherein the first portion has a first corner between the central member and the lateral flange and a second corner between the lateral flange and the arm member.

12. The invention of claim 11, wherein the first portion is approximately L-shaped if the first and second corners are straightened.

13. The invention of claim 1, wherein the first portion further comprises a second lateral flange (e.g., 436) extending from the central member for electrically coupling with a ground of a printed circuit board (PCB).

14. An electronic device comprising:
signal processing circuitry for converting received signals into electrical signals;
a connector for a coaxial cable for carrying electrical signals, the connector electrically coupled with the signal processing circuitry, the connector including a barrel having a conductive inner port and a conductive outer surface electrically separated from the conductive inner port;
a printed circuit board (PCB) for supporting the signal processing circuitry and the connector, the printed circuit board including a ground; and
a grounding bracket for grounding a coaxial cable connected to the barrel, the coaxial cable having an inner conductor and an outer conductive sheath electrically separated from the inner conductor, the grounding bracket including:
a first portion adapted to electrically couple (i) directly to the conductive outer surface of the barrel, and (ii) to the PCB ground; and
a second portion, electrically connected to the first portion and adapted to be electrically connected to a ground wire, such that the grounding bracket provides a grounding path between the conductive outer sheath of the coaxial cable and the PCB ground, and the ground wire, wherein:
the first portion includes an aperture for receipt on the barrel, the aperture configured for seating on the conductive outer surface of the barrel; and
the first portion of the grounding bracket comprises:
a central member including the aperture;
a first lateral flange extending from the central member; and
an arm member extending from the lateral flange and electrically connected to the second portion.

15. The invention of claim 14, wherein the electronic device is an optical network terminal (ONT).

16. The invention of claim 14, wherein the first portion and the second portion are a unitary member.

17. The invention of claim 14, wherein the first portion and the second portion are separate members in electrical communication.

18. The invention of claim 17, wherein the first portion includes an aperture for receipt on the barrel, the aperture configured for seating on the conductive outer surface of the barrel.

19. The invention of claim 18, wherein the first portion includes a flange attached to the PCB ground.

20. The invention of claim 17, wherein the grounding bracket is adapted to be mechanically supported by the barrel and has no mounting holes for receiving mechanical support other than the aperture.

21. The invention of claim 14, wherein the second portion includes a first bore for receiving a ground wire.

22. The invention of claim 21, wherein the second portion includes a second bore to accommodate a screw to clamp the ground wire into electrical contact with the second portion.

23. The invention of claim 22, wherein the first bore is oriented substantially perpendicular with respect to the second bore.

24. A method for grounding an interior coaxial cable comprising:
providing a grounding bracket for grounding a coaxial cable;
creating a grounding path comprising:
placing a first portion of the grounding bracket into direct electrical contact with an electrically conductive outer surface of a barrel of an electronic device;
electrically coupling a second portion of the grounding bracket with a ground wire; and
connecting a coaxial cable on the barrel, wherein:
the conductive sheath of the coaxial cable is electrically coupled with the grounding path,
the first portion includes an aperture for receipt on the barrel, the aperture configured for seating on the conductive outer surface of the barrel; and
the first portion of the grounding bracket comprises:
a central member including the aperture;
a first lateral flange extending from the central member; and
an arm member extending from the lateral flange and electrically connected to the second portion.

25. The method of claim 24, wherein the ground wire connects to a ground source, the ground source defining an end of the grounding path.

26. The method of claim 25, further comprising electrically coupling the grounding bracket to a ground on a printed circuit board.

27. A new use of a grounding bracket to ground a coaxial cable having an inner conductor and an outer conductive sheath electrically separated from the inner conductor, the grounding bracket comprising an electrically conductive body including (a) a first portion adapted to be electrically connected to the conductive outer surface of the barrel and (b) a second portion electrically connected to the first portion and adapted to be electrically connected to a ground wire, such that the grounding bracket provides a grounding path between the conductive outer sheath of the coaxial cable and the ground wire via the conductive outer surface of the barrel, the new use comprising:
creating a grounding path, comprising:
placing a first portion of the grounding bracket into direct electrical contact with an electrically conductive outer surface of a barrel of a coaxial-cable terminal of one of (i) an electronic device, (ii) a network terminal box, (iii) a coaxial-cable distribution box, (iv) a printed circuit board assembly, and (v) an interior optical network terminal;
electrically coupling a second portion of the grounding bracket with a ground wire; and
connecting the coaxial cable on the barrel, wherein:
the conductive sheath of the coaxial cable is electrically coupled with the grounding path,
the first portion includes an aperture for receipt on the barrel, the aperture configured for seating on the conductive outer surface of the barrel; and
the first portion of the grounding bracket comprises:
a central member including the aperture;
a first lateral flange extending from the central member; and
an arm member extending from the lateral flange and electrically connected to the second portion.

\* \* \* \* \*